(12) United States Patent
Barrett et al.

(10) Patent No.: US 7,454,543 B2
(45) Date of Patent: Nov. 18, 2008

(54) EARLY HIGH SPEED SERIALIZER-DESERIALIZER (HSS)INTERNAL RECEIVE (RX) INTERFACE FOR DATA SAMPLING CLOCK SIGNALS ON PARALLEL BUS

(75) Inventors: Wayne M. Barrett, Rochester, MN (US); Todd A. Greenfield, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 339 days.

(21) Appl. No.: 11/380,240

(22) Filed: Apr. 26, 2006

(65) Prior Publication Data

US 2007/0255867 A1 Nov. 1, 2007

(51) Int. Cl.
*G06F 17/50* (2006.01)
*G06F 13/38* (2006.01)

(52) U.S. Cl. .................. 710/62; 710/34; 341/100; 375/354; 375/371; 716/12

(58) Field of Classification Search ............ 710/34, 710/62; 341/100; 375/354, 371; 716/12
See application file for complete search history.

(56) References Cited

U.S. PATENT DOCUMENTS 6,288,656 B1 * 9/2001 Desai .................... 341/100
7,088,133 B2 * 8/2006 Lee et al. ................ 326/39

OTHER PUBLICATIONS

"Synchronous High Speed Serial Interface Clocking," IBM Technical Disclosure Bulletin, vol. 38 No. 4, Apr. 1995.*

* cited by examiner

*Primary Examiner*—Tammara R Peyton
(74) *Attorney, Agent, or Firm*—Bockhop & Associates

(57) ABSTRACT

In a method for reading data from a serial data source in a parallel format, data from the serial data source is deserialized by placing a plurality of predefined units of data onto a parallel bus and asserting a deserialization clock when each of the plurality of predefined units is valid on the parallel bus. A delayed clock pulse is generated a predetermined amount of time after each assertion of the deserialization clock. Each delayed pulse is repeated so as to generate an end point repeated clock pulse corresponding to each delayed pulse wherein the predetermined amount of time is an amount of time that ensures that each predefined unit of data on the parallel bus is valid when each end point repeated clock pulse is asserted.

5 Claims, 2 Drawing Sheets

EARLY HIGH SPEED SERIALIZER-DESERIALIZER (HSS) INTERNAL RECEIVE (RX) INTERFACE FOR DATA SAMPLING CLOCK SIGNALS ON PARALLEL BUS

BACKGROUND OF THE INVENTION

1. Field of the Invention

The present invention relates to digital clocking circuits and, more specifically, to a clocking circuit used in serial-to-parallel communications.

2. Description of the Prior Art

In many computer systems, high Speed Serializer-deserializer (HSS) cores are used in application-specific integrated circuits (ASICs) and custom integrated circuits for communication from processor-to-processor and processor-to-input/output devices. The receiving portion of an HSS core takes one (or more) high speed serial data lanes and converts each data lane into parallel data at a much slower frequency. In one example, shown in FIG. 1A, a representative existing HSS internal receive (Rx) interface consists of a clock (RxDCLK) and a parallel data bus (RxD(7:0)). (It should be noted that use of an 8-bit wide bus is used as an example only.) A deserializer 10 receives data from a serial data stream and places units of the data onto a parallel bus. Each time a new unit is placed on the parallel bus, the clock 12 asserts an RxDCLK signal, indicating that the data on the parallel bus is valid. Given that the RxDCLK signal lacks sufficient power to enable all of the devices that typically access the data; the clock has to be repeated by a clock tree 16. The clock tree 16 includes an increasing series of repeaters 18 that generate a duplicate of the RxDCLK signal from the clock 12, delayed by a predicted amount of time. When the delay of each successive repeater 18 is added together, a substantial tree delay is propagated through the system.

Sampling the data with a device 14 can be problematic because the repeated clock signal at an end point of the clock tree may have a substantial delay from the original RxDCLK signal generated by the clock 12. In a timing diagram 20, as shown in FIG. 1B, the leading edge of the RxDCLK signal plus the tree delay could be half of a clock cycle, or more, after the leading edge of the RxDCLK signal by itself. If the device 14 reads the data on the leading edge then the data on the parallel bus is not valid when the leading edge of the RxDCLK signal plus the tree delay is asserted.

Returning to FIG. 1A, one existing solution to this problem is to add a delay 20 equal to the tree delay to the parallel data, thereby matching the delay of the clock tree. As can be seen in FIG. 1B, this causes the data on the parallel bus (RxD(7:0)+DATA DELAY) to be aligned with the RxDCLK signal plus the tree delay.

This solution has several disadvantages, including: (a) extra cells are needed for delaying each of the data signals; (b) manual intervention is required in physical design of the chip to ensure that the delays added to the parallel data paths end up being the correct amount to match the clock tree delay and the variation of two relatively long paths need to be managed; and (c) the delay added to the parallel data adds to the overall latency of the interface.

Therefore, there is a need for a system in which parallel data may be read by a plurality of devices with a minimum latency.

SUMMARY OF THE INVENTION

The disadvantages of the prior art are overcome by the present invention which, in one aspect, is a method for reading data from a serial data source in a parallel format, in which data from the serial data source is deserialized by placing a plurality of predefined units of data onto a parallel bus and asserting a deserialization clock when each of the plurality of predefined units is valid on the parallel bus. A delayed clock pulse is generated a predetermined amount of time after each assertion of the deserialization clock. Each delayed pulse is repeated so as to generate an end point repeated clock pulse corresponding to each delayed pulse wherein the predetermined amount of time is an amount of time that ensures that each predefined unit of data on the parallel bus is valid when each end point repeated clock pulse is asserted.

In another aspect, the invention is a method of accessing data from a data source in a system that employs a clock tree, in which a read pulse is generated periodically. The read pulse is repeated so as to generate a plurality of periodic end point repeated clock pulses. The read pulse is delayed prior to the repeating step so as to cause each of the end point repeated clock pulses to be delayed from the corresponding read pulse by a predetermined amount of time.

In yet another aspect, the invention is a data communication circuit to facilitate communication between a deserializer, which is responsive to a serial data stream and which puts data onto a parallel bus, and a device that is in data communication with the parallel bus. The circuit includes a deserialization clock, a delay unit and a clock tree. The deserialization clock periodically asserts a clock read pulse each time data on the parallel bus is valid. The delay unit receives the clock read pulse from the deserialization clock and periodically asserts a corresponding delayed clock pulse. The delayed clock pulse is delayed from the clock read pulse by a predetermined period. The clock tree that repeats the delayed clock pulse, thereby periodically asserting a plurality of end point repeated clock pulses. Each of the end point repeated clock signals has a substantially simultaneous leading edge. The predetermined amount of time is selected so as to cause each of the end point repeated clock signals to be asserted when data on the parallel bus is valid, thereby enabling the device to read data from the parallel bus.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1A:
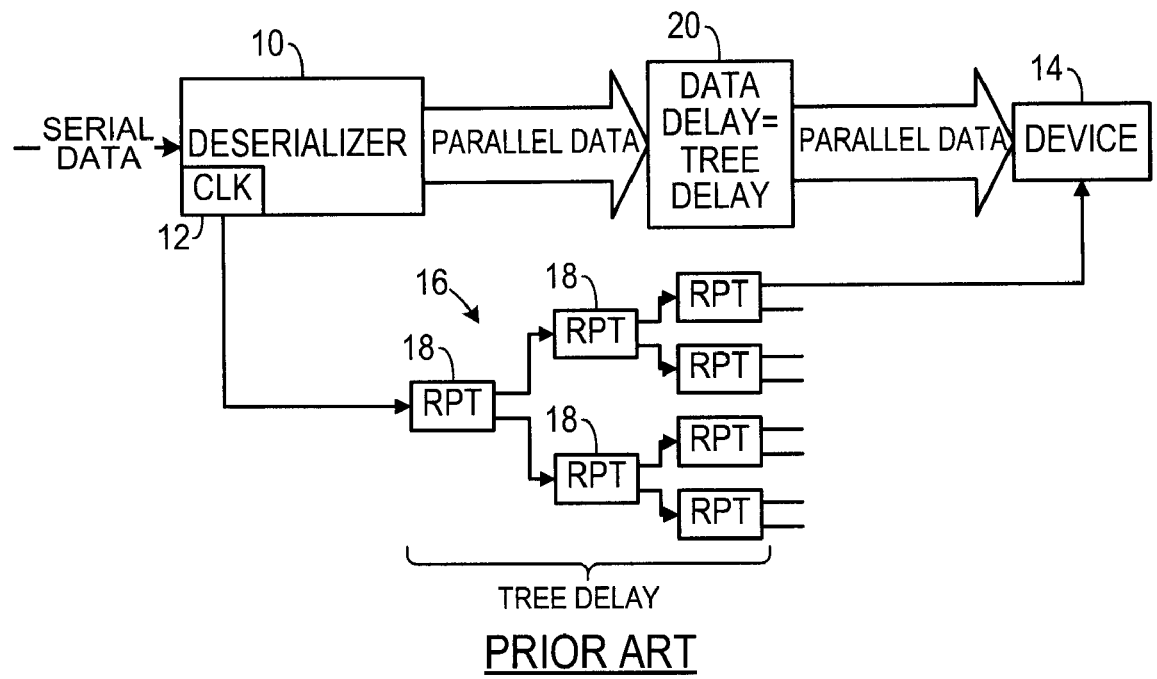
FIG. 1A is a block diagram of a typical prior art clocking mechanism used in reading deserialized data.
Figure 1B:
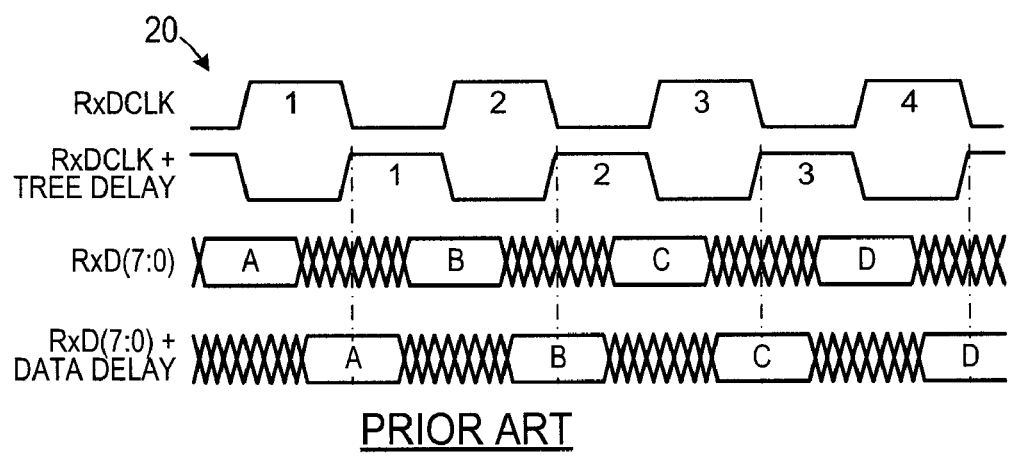
FIG. 1B is a timing diagram relating to the prior art system shown in FIG. 1A.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

Figure 2A:
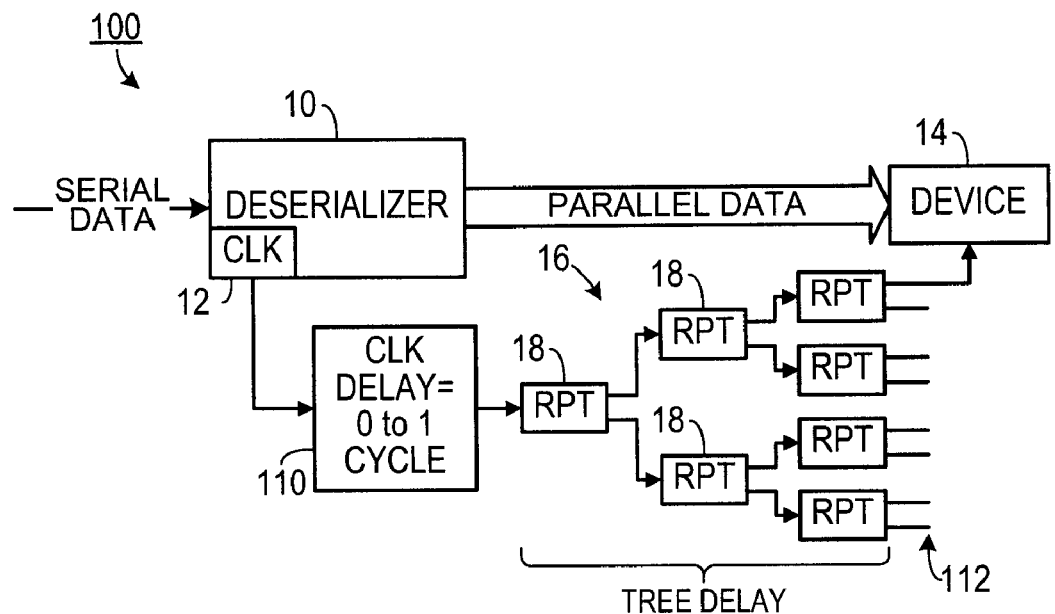
FIG. 2A is a block diagram of an illustrative embodiment of a clocking mechanism according to the invention.
Figure 2B:
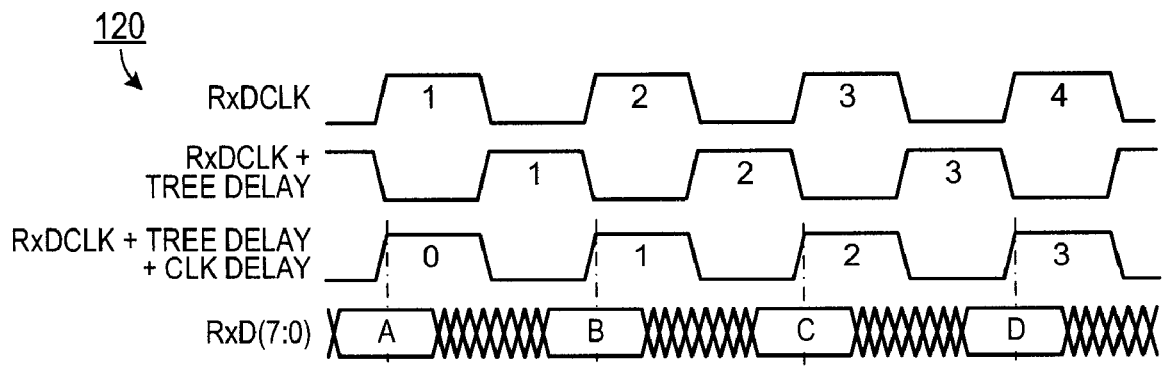
FIG. 2B is a timing diagram relating to the mechanism shown in FIG. 2A.

As shown in FIGS. 2A and 2B, one representative embodiment 100 of the invention adds a clock delay 110 to the output of the clock 12 from the deserializer 10 prior to the clock tree 16. The delay is for an amount of time that causes the clock signal a the end points 112 of the clock tree 16 to have leading edges that are substantially temporally aligned with the leading edge of the deserializer clock signal. The delay can be in a range between zero cycles to one cycle of the deserializer clock 12, depending on the tree delay.

As can be seen in the timing diagram 120 in FIG. 2B, the end point clock signal (RxDCLK+TREE DELAY+CLK DELAY) has a waveform that is substantially aligned with the clock 12 (RxDCLK) from the deserializer 12, except that at any given time, the end point clock signal is one cycle behind the RxDCLK signal. By delaying the end point clock signal, the data does not have to be delayed and, when running in steady state, the devices 14 that read the parallel data do not experience substantial delay.

In the example shown in FIG. 2B, RxDCLK is asserted with pulse "1" when data unit "A" is valid on the data bus and is asserted again with pulse "2" when data unit "B" is valid. Without the clock delay unit 110, the end point clock signal (RxDCLK+TREE DELAY) would be delayed one-half cycle from the RxDCLK signal such that pulse "1" would occur half-way between pulses "1" and "2" of the RxDCLK signal. Thus, the leading edge of the end point clock signal would occur when data on the parallel bus (RxD(7:0)) is invalid. However, by delaying the RxDCLK signal by roughly one-half a cycle, the resulting end point clock signal (RxDCLK+ TREE DELAY CLK DELAY) is aligned with the RxDCLK signal; however, pulse "1" of the end point clock signal occurs essentially simultaneously with pulse "2" of the RxDCLK signal. Thus, each of the end point repeated clock pulses is in substantial temporal alignment with a next cycle of a corresponding RxDCLK pulse. Therefore, while packet "B" is valid on the parallel bus when pulse "2" of the RxDCLK signal is asserted, it is read at roughly the same time by the device 14 when the delayed pulse of the end point clock signal corresponding to pulse "1" is asserted. By doing this, the data from the deserializer 10 is available to the device 14 as soon as it is valid on the parallel bus, rather than having to be delayed by roughly one-half cycle.

In one embodiment, the amount of the CLK DELAY may be determined by determining the total tree delay and then subtracting that amount from one complete cycle of the deserializer clock 12. In some applications, it might be advisable to skew the end point clock pulses slightly from the RxDCLK and it is intended that the claims below apply to all such applications.

This solution becomes increasingly favorable when the delay of the clock tree is a sizable fraction of the RxDCLK clock period. The invention offers several advantages over other systems, including: (a) it uses reduced chip area due to elimination of parallel data delay cells; (b) timing analysis is easier to complete in the physical design due to having only one path with a large variability (i.e., the single CLK DELAY) to manage; and (c) the overall latency of the interface is improved by one clock cycle.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A data communication circuit to facilitate communication between a deserializer, which is responsive to a serial data stream and which puts data onto a parallel bus, and a device that is in data communication with the parallel bus, the circuit comprising:
  a. a deserialization clock that periodically asserts a clock read pulse each time data on the parallel bus is valid;
  b. a delay unit that receives the clock read pulse from the deserialization clock and that periodically asserts a corresponding delayed clock pulse, the delayed clock pulse being delayed from the clock read pulse by a predetermined period; and
  c. a clock tree that repeats the delayed clock pulse, thereby periodically asserting a plurality of end point repeated clock pulses, wherein each of the end point repeated clock signals has a substantially simultaneous leading edge, the predetermined amount of time selected so as to cause each of the end point repeated clock signals to be asserted when data on the parallel bus is valid, thereby enabling the device to read data from the parallel bus.

2. The data communication circuit of claim 1, wherein the predetermined amount of time is between zero cycles of the deserialization clock and one cycle of the deserialization clock.

3. The data communication circuit of claim 1, wherein the predetermined amount of time is selected so that each of the end point repeated clock pulses is in substantial temporal alignment with a next cycle of a corresponding clock read pulse.

4. The data communication circuit of claim 1, wherein the clock tree comprises at least one clock signal repeater.

5. The data communication circuit of claim 1, wherein the clock tree has a tree delay equal to an amount of time between an assertion of the clock read pulse and an assertion of the corresponding end point repeated clock pulse and wherein the predetermined amount of time equals one cycle of the deserialization clock minus the tree delay.

* * * * *